United States Patent [19]

Szedon et al.

[11] 3,911,475

[45] Oct. 7, 1975

[54] ENCAPSULATED SOLID STATE ELECTRONIC DEVICES HAVING A SEALED LEAD-ENCAPSULANT INTERFACE

[75] Inventors: John R. Szedon, Eight-Four, Pa.; John A. Jackson, Tempe, Ariz.; David C. Phillips, Pittsburgh, Pa.

[73] Assignee: Westinghouse Electric Corporation, Pittsburgh, Pa.

[22] Filed: Mar. 4, 1974

[21] Appl. No.: 447,617

Related U.S. Application Data

[62] Division of Ser. No. 245,416, April 19, 1972, Pat. No. 3,821,099.

[52] U.S. Cl. .................... 357/72; 204/181; 260/78

[51] Int. Cl.² ........................................ H01L 23/28

[58] Field of Search .......... 357/72; 260/78; 204/181

[56] References Cited

UNITED STATES PATENTS

| | | | |
|---|---|---|---|
| 3,179,614 | 4/1965 | Edwards | 357/72 |
| 3,179,631 | 4/1965 | Endrex | 357/72 |
| 3,179,632 | 4/1965 | Hendrix | 357/72 |
| 3,486,084 | 12/1969 | Zido | 357/72 |
| 3,566,208 | 2/1971 | Wang | 357/72 |
| 3,597,269 | 8/1971 | Chang et al. | 357/8 |
| 3,700,497 | 10/1972 | Epifano et al. | 357/72 |

*Primary Examiner*—Andrew J. James
*Attorney, Agent, or Firm*—D. P. Cillo

[57] ABSTRACT

An encapsulated solid state electronic device, such as a semiconductor, with attached metallic connection leads is made moisture resistant by coating the leads with a smooth, flexible, pinhole-free resinous barrier film, which intimately bonds to the leads and encapsulant, providing a void-free lead-encapsulated interface.

10 Claims, 6 Drawing Figures

ENCAPSULATED SOLID STATE ELECTRONIC DEVICES HAVING A SEALED LEAD-ENCAPSULANT INTERFACE

CROSS REFERENCE TO RELATED APPLICATIONS

The present application is a divisional application of application U.S. Ser. No. 245,416, filed on Apr. 19, 1972 and now U.S. Pat. No. 3,821,099.

BACKGROUND OF THE INVENTION

The present invention relates to encapsulating solid state electronic devices such as semiconductors. Generally, the electrical characteristics of semiconductor devices having semiconductor surfaces exposed to the atmosphere will deteriorate with time due to moisture. For this reason, in many cases, such devices together with the connection leads are housed in an encapsulating plastic.

In view of the hygroscopicity and air permeability of the encapsulating plastics, it has heretofore been almost impossible to provide perfect shielding of the semiconductor surfaces. Moisture penetration is especially prevalant at the lead-encapsulant interface, because of the lack of a microsopically intimate bond. Greater moisture resistance can be achieved by using glass seals over the connection leads. The seals are formed by melting glass sleeves or by firing a fritted glass film. This lead and contact metallurgy is complicated, however, and the resulting devices are expensive.

Since the unit costs of fabricating active semiconductor elements, such as diodes or transistors, by virtue of batch fabrication techniques, are often far below the unit costs of the packages into which the elements are inserted for mechanical and environmental protection, there is a need for effective yet inexpensive moisture resistant sealing methods and materials.

SUMMARY OF THE INVENTION

The above difficulties are solved and the above need met by depositing a smooth, flexible, pinhole-free, barrier film, such as polyimide resin, preferably from a nonaqueous electrodeposition composition, onto the connection leads connected with the solid state electronic element. This film intimately bonds to the lead metal and provides a smooth adherable surface for the encapsulating plastic, providing a complete and intimate seal, so that there are no voids or air pockets at the lead-encapsulant interface.

BRIEF DESCRIPTION OF THE DRAWINGS

For a better understanding of the invention, reference may be made to the preferred embodiments, exemplary of the invention shown in the accompanying drawings, in which.

DESCRIPTION OF THE PREFERRED EMBODIMENTS

Figure 1:
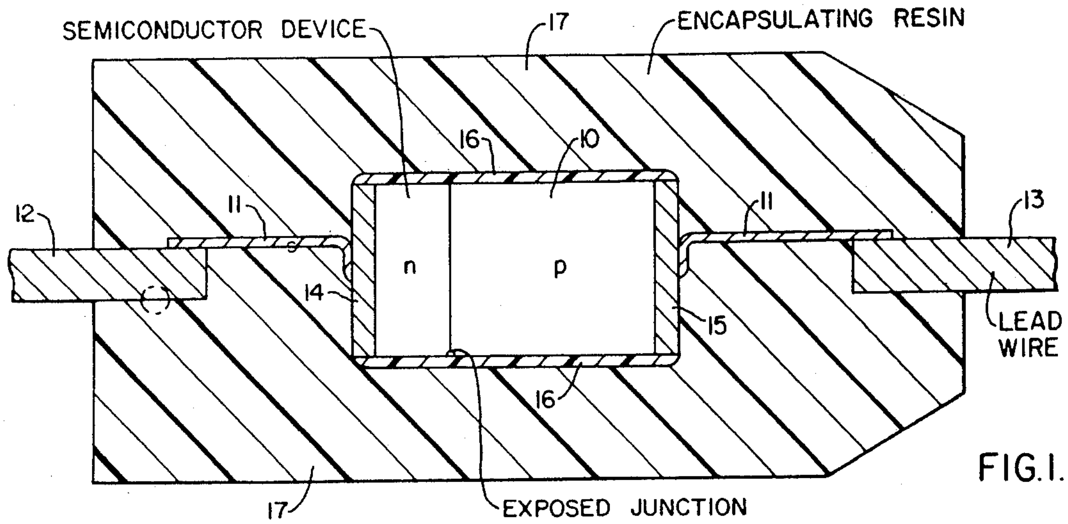
FIG. 1 is a cross-sectional view of an encapsulated diode, with FIG. 1*a* showing the prior art lead-encapsulant interface, and FIG. 1*b* showing the void-free lead-encapsulant interface resulting from the flexible, resinous, barrier film of this invention coated onto the connection lead.

In the drawings, FIG. 1 shows an encapsulated solid state electronic device. This device can be a miniature integrated circuit or discrete semiconductor devices, such as, for example, diodes, transistors and solid state switches, such as, for example, gate controlled rectifiers. The semiconductor element, shown as 10, is comprised of a body of suitable semiconductor material, preferably silicon, having an n-type region, a p-type region and a p-n junction disposed therebetween and extending to at least one surface of the body where it is exposed.

Metallic connection leads such as interconnection conductors and lead wires are also shown. Internal interconnection conductors 11 connect the lead wires 12 and 13 to the metal contacts 14 and 15 which are attached to the diode semiconductor element by evaporation, plating or any other suitable means. In some simple device structures the interconnection conductors may be absent, in which cases the lead wires connect directly to the metal contact regions on the circuit or device. The interconnection conductors are frequently made of gold or aluminum and are much finer than the lead wires. The lead wires are generally made of gold or silver plated copper or aluminum wire. When used, the interconnection conductors are usually attached by thermocompression bonding or ultrasonic welding to the contacts and lead wires.

A protective coating 16, which may comprise a silicone varnish, is usually applied between the device 10 and the rigid plastic encapsulant 17. The encapsulating plastics that may be used are well known in the art and are selected from epoxy resins, polyester resins, silicon resins, phenolic resins and diallylphthalate resins, among others, with epoxy resins preferred because they are thermosetting, provide good mechanical protection and have limited shrinkability.

The encapsulating plastic can contain fillers, such as silica, quartz, beryl and talc, between about 25 to 75 weight percent of the encapsulating mixture, to lower costs, reduce shrinkage of the resin and help to match the coefficient of expansion of the encapsulated device.

Figure 1B:
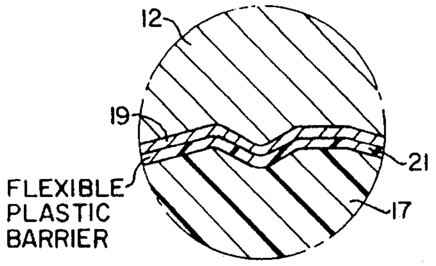
Figure 1A:
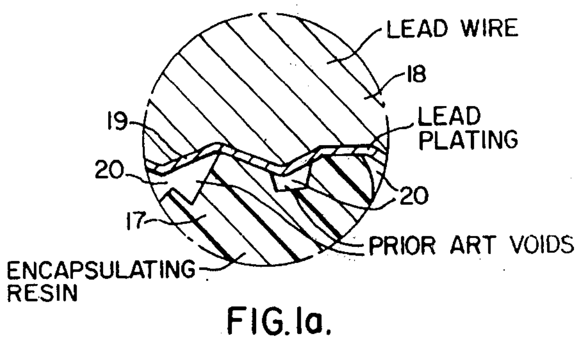

A prior art metallic connection lead is shown in FIG. 1*a* as wire 18 coated with a silver plating 19, which contacts encapsulating plastic 17. Also shown are voids 20, between the lead wire plating and the encapsulating plastic, which allow moisture to penetrate to the device.

In the present invention, lead wire 12, as shown in FIG. 1*b*, has the intimately coated, flexible, smooth resinous film 21 of this invention, coating the silver plating 19 and providing a microscopically intimate bond therewith. The resinous film 21 also provides a smooth adherable surface for the encapsulating plastic 17, so there are no voids or pores between the plating 19 and the epoxy encapsulating resin 17 at the lead-encapsulant interface.

To assure a microscopically intimate bond at the lead-encapsulant interface, an electrodeposition coating technique is preferred for coating the resinous barrier film onto the lead wire and interconnection conductor. To provide pinhole-free films, the resinous film should be electrodeposited from a nonaqueous electrodeposition composition. Preferred resinous films are cured polyimide resins which have recently come into use as high temperature insulating films. Other suitable coating methods and barrier film resins can be used which will intimately bond to the metallic connection leads and provide an adherable smooth surface for the encapsulating plastic, so there is a void-free interface.

Polyimide films can be produced by electrophoretic deposition of polyamide acids in a water emulsion system, but such systems result in heavily pitted polymer coatings which may be unsuitable for the present application, due to gas evolution from water electrolysis. In accordance with this invention applicants preferably apply coatings electrodeposited from either colloidal or noncolloidal nonaqueous compositions of polyamic acid salts, and imidize, generally by a heat source, to cure the coating and convert it to a polyimide film.

One of the cured imide films, after electrodeposition of polyamic acid polymer and subsequent heating in accordance with this invention, comprises polymers of aromatic polyimides having the recurring unit:

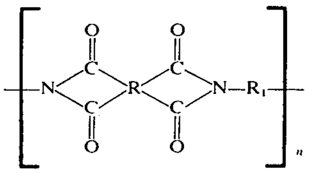

wherein $n$ is at least 15, R is at least one tetravalent organic radical selected from the group consisting of:

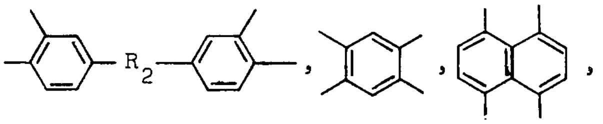

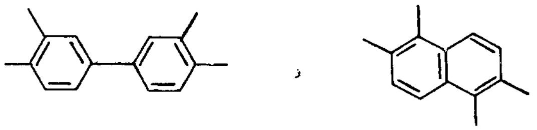

and

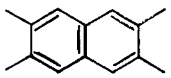

$R_2$ being selected from the group consisting of divalent aliphatic hydrocarbon radicals having from 1 to 4 carbon atoms and carbonyl, oxy, sulfo and sulfonyl radicals and in which $R_1$ is at least one divalent radical selected from the group consisting of:

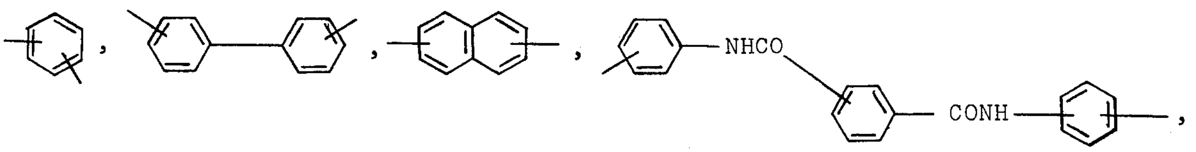

and

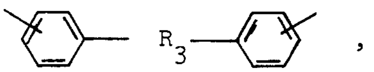

in which $R_3$ is a divalent organic radical selected from the group consisting of $R_2$, silico and amido radicals. Polymers containing two or more of the R and/or $R_1$ radicals, especially multiple series of $R_1$ containing amido radicals, are particularly valuable in some instances. The aromatic polyamide-imide resins, represented by certain of the foregoing formulae are described and claimed in U.S. Pat. No. 3,179,635.

The described, essentially insoluble, cured, high temperature films are derived from certain soluble aromatic polyamic acids in solvent solution. In the present invention, the polyamic acid is reacted to form a salt in a dual solvent system. The film after application to the interconnection conductors and/or lead wires by electrodeposition methods is heated for a time sufficient to cure the precursor film to its solid resinous state.

In general, the soluble polyamic acid precursors are prepared by admixing a suitable aromatic tetracarboxylic dianhydride with an aromatic diamine in a suitable solvent at room temperature. Examples of suitable dianhydrides are pyromellitic dianhydride, benzophenone tetracarobxylic dianhydride, naphthylene tetracarboxylic dianhydride and the like. Examples of suitable diamines are m-phenylene diamine, methylene dianiline, diaminodiphenyl ether, diaminobenzanilide and the like. The polyamic acid precursors are well known and commercially available in solvent solutions.

The same general procedure is employed when a derivative of an aromatic tricarboxylic anhydride, e.g., trimellitic anhydride chloride or the ester diacid chloride or trimellitic anhydride is used in place of the aforesaid aromatic dianhydride. The abovenamed diamines are also suitable for use with the tricarboxylic anhydride derivatives.

One of the aromatic polyamic acid polymers suitable for use as a soluble polyamide acid precursor to this invention has the recurring unit:

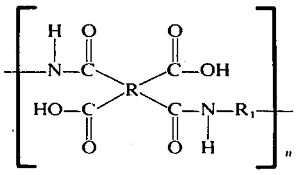

in which $n$ is at least 15 and R and $R_1$ are identical to the description hereinabove relating to the solid aromatic polyimide and polyamide-imide resins. It should be understood that suitable polyamic acids may also contain two or more of the R and/or $R_1$ radicals.

Suitable solvents for the polyamic acids are aprotic solvents, i.e., solvent which will neither lose a proton to the solute nor gain a proton from the solute, for example, the normally liquid organic solvents of the N, N-dialkylcarboxyl-amide class, preferably the lower molecular weight members of this class, such as dimethyl acetamide, dimethyl formamide, and N-methyl-2-pyrrolidone. Other useful aprotic solvents include dimethyl sulfoxide and pyridine. The solvents can be used individually or in combinations of two or more. The solvents are easily removed by heating in a drying tower or oven.

In addition to the aforementioned aromatic polyimide and polyamide-imide recurring unit wherein R was a tetravalent organic radical, other cured resins which are particularly suitable as films which can be electrodeposited in accordance with this invention are derived from a trivalent anhydride and have the structure:

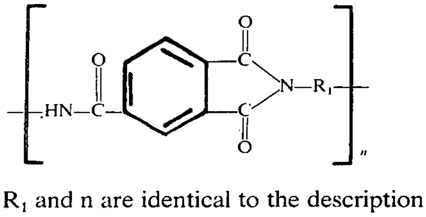

wherein $R_1$ and n are identical to the description hereinabove relating to the solid aromatic polyimide and polyamide-imide resins.

Particularly valuable films are provided when $R_1$ is

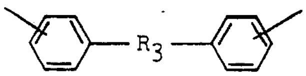

where $R_3$ is an oxy or methylene (—$CH_2$—) radical.

The soluble polyamic acid precursors for the above trivalent derived polyamide-imide resins include in repeating form one or both of the structures:

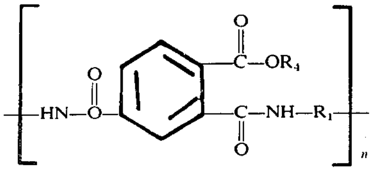

and

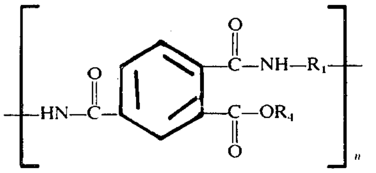

wherein $R_1$ and $n$ are identical to the description hereinabove and $R_4$ is —H. The same solvents as previously described can be used for the above aromatic polyamic acids.

In the process of this invention, polyamic acids have been successfully electrodeposited onto interconnection conductors and lead wires of solid state devices from colloidal dispersions and noncolloidal solutions of amine salts of the same polyamic acids in mixed organic nonaqueous solvent systems.

The colloidal composition consists of a colloidal dispersion of the amine salt of the polyimide precursor within a critically balanced organic solvent mixture. The chemical process is highly complex and probably involves polymer salt formation:

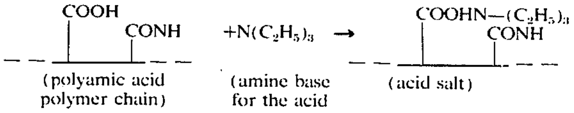

Under the influence of an electric field it is envisaged that the salt ionizes to produce the triethylammonium ion and carboxyl ion of the polymer which subsequently migrate to cathode and anode respectively:

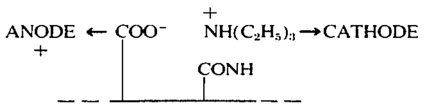

Anode reactions lead to the reconstitution of the parent polyamic acid, which on subsequent imidization, generally by a heat cure, loses water to produce the corresponding polyimide film, which microscopically bonds to the metal anode, and forms a smooth adherable outer surface. Possible anode reactions are:

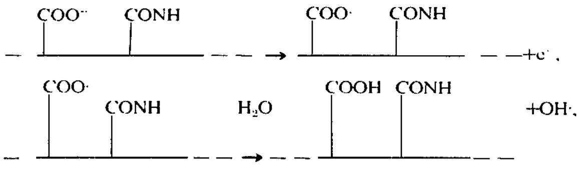

and on heat cure

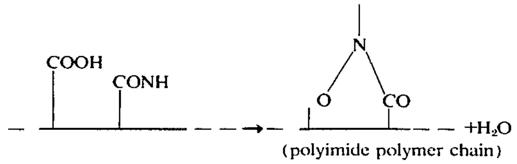

The nonaqueous medium in which the acid salt is dispersed consists of a liquid nonelectrolizable solvent which is not capable of dissolving the acid salt of the polymer chain. This nonsolvent for the acid salt polymer must not gas to any great extent at the electrodes due to electrolysis when a voltage is applied to the system. Preferred solvents are nonelectrolizable solvents which are a nonsolvent for the acid salt of the polymer and would include liquid aliphatic (straight and branched chain) and aromatic ketones, such as, for example, acetone, methyl isobutyl ketone, methylethylketone, methyl n-propylketone, diethylketone, mesityloxide, cyclohexanone, methyl n-butyl ketone, ethyl n-butyl ketone, methyl n-amyl ketone, acetophenone, methyl n-hexylketone, isophorone and disobutylketone.

The basic organic nitrogen containing compounds which react with the acid polymer to form an acid salt include organic tertiary aliphatic and aromatic amines such as, for example, trimethylamine, triethylamine, N, N-dimethylbenzylamine, tri-n-propylamine, tri-n-butylamine, N-ethylpiperidine, N-allylpiperidine, N-ethylmorpholine, N, N-diethyl-m-toluidine, N, N-diethyl-p-toluidine, N-allylmoropholine, N, N-diethylaniline, pyridine and imidazoles such as, for example, imidazole, 1-methylimidazole, 4-methylimidazole, 5-methylimidazole, 1-propylimidazole, 1,2-dimethylimidazole, 1-ethyl-2-methylimidazole and 1-phenylimidazole.

In preparation of the conducting electrodeposition composition the component materials must be added within critical wt. % ratios. The process for preparing the colloidal dispersion consists of (1) reacting a polyamic acid polymer in a nonaqueous, organic solvent, which is preferably nonelectrolizable, with a nitrogen containing base selected from the group consisting of amines and imidazoles to form an acid salt, (2) adding the salt solution to a rapidly stirred nonaqueous, organic nonsolvent for the polyamic acid salt which is substantially nonelectrolizable, to provide the colloidal dispersion of the salt within the solvent mixture.

The colloidal electrodeposition composition is formed by addition of about 1 part by weight polyamic acid polymer, about 29–37 parts solvent for said acid, based on 1 part by weight acid, about 0.8–1.2 parts nitrogen containing base and about 50–150 parts nonsolvent for the salt of the acid. Under 29 parts solvent for the polymer will cause viscosity problems and precipitation and over 37 parts solvent for the polymer will impede electrocoating because the polymer will stay in solution. Under 50 parts nonsolvent for the acid salt will impede electrocoating because the polymer will stay in solution. Over about 150 parts nonsolvent for the acid salt will cause precipitation of the polymer within the two-solvent medium.

The process for preparing the noncolloidal solution consists of (1) reacting a polyamic acid polymer in a nonaqueous, organic solvent, which is preferably nonelectrolizable, with a nitrogen containing base selected from the group consisting of amines and imidazoles to form an acid salt, (2) adding a nonaqueous, organic, nonsolvent for the polyamic acid salt which is substantially nonelectrolizable, dropwise to the salt solution, so as to just keep the salt in solution and prevent its precipitation.

The noncolloidal electrodeposition composition is formed by addition, in critical proportions, of about 1 part by weight polyamic acid polymer, about 12.5 to 15.5 parts solvent for said acid, based on 1 part by weight acid, about 0.8–1.5 parts nitrogen containing base and about 7 to 9 parts nonsolvent for the salt of the acid. An excess of nonsolvent for the polymer causes immediate precipitation of the polyamic acid salt within the bath medium.

Substitution of any electrolizable compounds for the solvents or bases, such as ammonium hydroxide inorganic type base, water, methanol, ethanol and aqueous sodium or potassium hydroxide will cause pitting in the final electrodeposited film.

Figure 2:
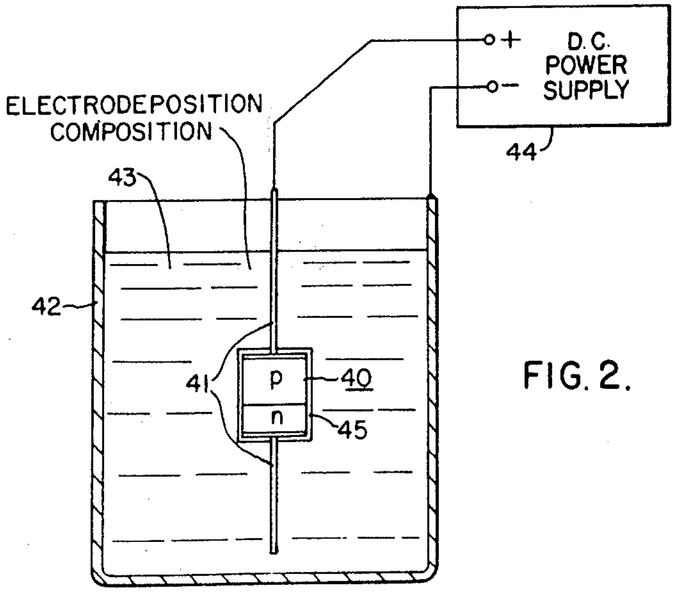
FIG. 2 is a schematic drawing of the preferred coating apparatus.

As shown in FIG. 2 of the drawings, the solid state device 40, such as a diode, with attached connection leads 41 is suspended from its positive end in a metal container 42 and centrally immersed in the conducting, nonaqueous electrodeposition composition bath 43. If hung from its negative end, the upper half of the diode would be coated preferentially. The positive lead wire is connected to the positive terminal of d.c. power supply 44 and the container is made cathode by connection to the negative terminal as shown. The bath may be either a colloidal dispersion of the organic salt of a polyimide precursor or a noncolloidal solution of the organic salt of a polyimide precursor. The bath will have a pH of about 9–10 and is maintained at ambient temperature.

A potential difference is applied between the metallic connection lead of the solid state device and the metal container acting as a negative electrode at a potential between about 10 to 100 volts. This provides a current density between the connection lead 41 (anode) and the container electrode 42 (cathode) of between about 2 to 10 mA/sq. in. of negative electrode plus metallic connection lead surface. The distance between electrodes can range between about 0.5 inch to 4 inches. The potential difference is applied for about 15 to 45 seconds to provide a 0.001 inch thick (after cure)polyimide coating. The electronic device is then heated from about 50°C to 200°C over a period of about 20 to 45 minutes to cure the coating.

This preferred process, using the above-described nonaqueous electrodeposition compositions, produces a pinhole-free, continuous, polyimide coating which securely bonds to the lead wires. The diode itself can be coated with a protective silicone coating such as silicone stopcock grease 45 to mask it against polyimide deposition. The grease is unaffected by the cure cycle and can be easily wiped off at the end of the cure.

EXAMPLE 1

A colloidal polyamic acid electrodeposition composition was formed by: (1) mixing 8.7 grams of polyamic acid polymer dissolved in 44.3 grams of solvent for the polymer (50 ml of a polyimide wire enamel solution having 16.5 wt. % solids content and sold commercially by DuPont under the trade name Pyre M. L. Polyimide Wire Enamel) with 219 grams (200 ml) of dimethylsulfoxide solvent for the polymer; adding 7.3 grams (10 ml) of triethylamine dropwise to produce the amine salt having free carboxyl groups present. The resulting solution, containing 0.8 parts by weight organic base and 30 parts by weight combined solvent for the polymer to 1 part acid polymer, was vigorously stirred, heated to about 50°C and held at that temperature for 15 minutes; (2) this solution was slowly added, with vigorous stirring, to 629 grams (800 ml) of acetone, a nonsolvent for the acid salt to provide a composition containing 72 parts by weight nonsolvent for the polymer to 1 part acid polymer. This provided a colloidal composition having a pH between about 8–10.

This colloidal composition was added to a 5 inches high aluminum cylinder having a closed bottom 2 ¼ inches in diameter. The cylinder was made the cathode of the system while the anode was the silver plated copper wire leads of a diode. The leads were about 0.05 inch in diameter, and were soldered directly to metal contact regions on the silicon chip.

The semiconductor surface between the metal contact regions was exposed by scribbing and cleaving square units from a large uniform water. The semiconductor had two regions of opposite type semiconductivity. It contained a p-type heavily diffused region and an n-type silicon of appropriate doping and thickness to support the desired rectifier blocking voltage. It is the exposed p-n junction, at the surface of the body, as shown in FIG. 1, which is sensitive to moisture penetration from outside the package. Such sensitivity exists even if the silicon surface of the chip has been coated with a silicone varnish, since moisture can eventually penetrate even such a protective layer.

The diode was hung from its positive end and centrally placed in the colloidal composition. The diode body itself was coated with silicone stopcock grease. prior to immersion to mask it against polyimide deposition. A potential difference was then applied between the cylinder and diode leads, the cylinder and the positive end of the diode being connected to the negative and positive terminals respectively of a variable voltage d.c. power supply. Under the influence of the electric field it is envisaged that the salt ionizes to produce the triethylammonium ion and carboxyl ion of the polymer which subsequently migrate to the cathode and anode respectively. A constant potential difference of 25 volts was applied for 30 seconds. This provided a current density of about 5 mA/sq. in. of electrode surface.

The diode was removed from the composition and heated from 50° to 200°C in a convection oven over a 35-minute period to cure the coating on the diode lead wires. This produced a pinhole-free, smooth, tough, very adherent polyimide coating. It was about 0.001 inch thick and well bonded to the lead wires. The silicone coating on the diode was not coated with polyimide.

Several diodes coated with polyimide as above were vacuum baked at 150°C for 1 hour prior to epoxy molding of the encapsulating package. The diodes with polyimide coated lead wires were then transfer molded at 150°C and 400 psi with a solid, granular, mineral filled epoxy resin (glycidyl ether) molding compound having a heat distortion temperature at 282°F at 264 psi (sold commercially by Pacific Resins & Chemicals, Inc. under the trade name EMC 90 Epoxy Molding Compound). The encapsulated diode units were post-baked for 16 hours at 170°C to insure maximum cross-linking of the plastic. These units were compared with standard units similar in all respects but not having a polyimide coating on the wire leads.

Units from both batches were simultaneously subjected to 5 psig. steam ambient in a pressure cooker. one hour steam cycles were used. The units were dried with forced air for at least 10 minutes prior to electrical evaluation. Reverse current was monitored over the range of $10^{-9}$ to $10^{-3}$ ampere. A unit was considered to have failed the test if the reverse current exceeded $10^{-7}$ ampere at 400 volts reverse bias.

Figure 3A:
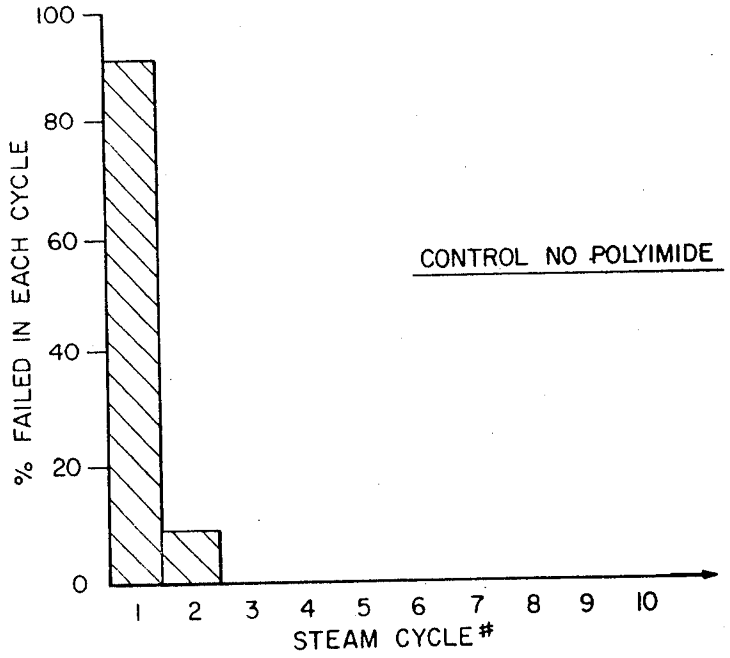
FIG. 3*a* graphically shows percentage of encapsulated control diode units failing in a given interval of steam exposure.
Figure 3B:
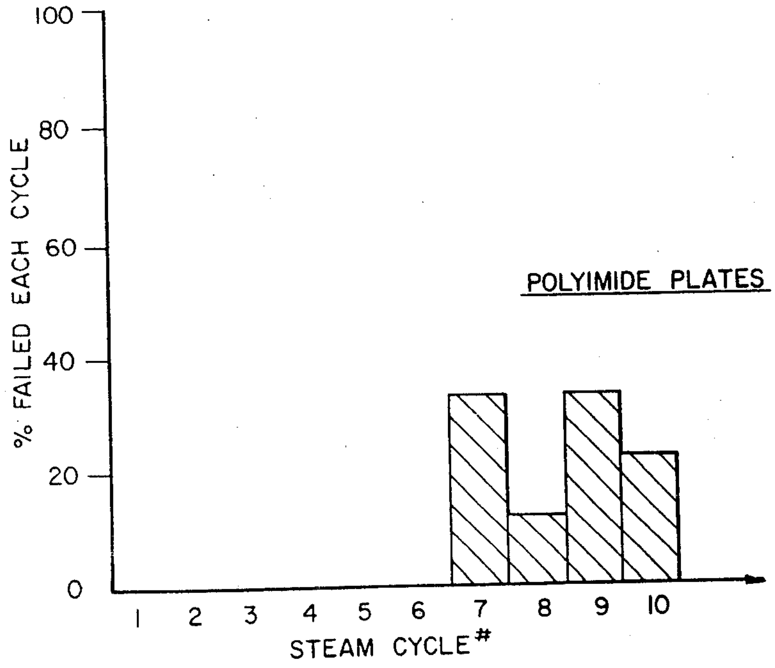
FIG. 3*b* graphically shows percentage of encapsulated polyimide coated diode units failing in a given interval of steam exposure.

FIG. 3*a* and FIG. 3*b* of the drawings show histograms giving the percentage of total units failing in a given interval of steam exposure. All standard units failed by the end of the second interval (FIG. 3*a*). None of the polyimide coated units of this invention failed during the first six steam exposure intervals, but all failed in a distribution over the next four intervals (FIG. 3*b*).

The use of the polyimide coating on lead wires and interconnection conductors improves time to failure and distribution of failure for lead mount diodes. This is attributed to production of a better seal at the surface of the lead. A very good polyimide-metal bond can be seen in cross-sectional photomicrographs of polyimide coated diode leads.

The polyimide process yields films free of voids and pinholes over the leads regardless of the surface finish. This is due to the metal seeking potential of the charged polymer-salt particles, i.e., bare metal areas are coated in preference to areas which are already slightly coated. In fact, projections or sharp edges on rough surfaces should initially plate preferentially due to local enhancement of the electrical field which drives the particles to be plated. As the film builds over these regions, reduction of the local field strength should result in very uniform films in the 0.5 to 5 mil thickness range of current interest with diodes. There is no question that the polyimide-lead interface will be more intimate than the epoxy-lead interface in normal production units. It is also expected that the epoxy should adhere better to the polyimide film than to the metal directly, since the surface is a uniform organic layer, providing better intermolecular compatability than an irregular metallic substrate.

We claim:

1. A solid state electronic device, metallic electrical connection leads attached to said device and a rigid encapsulant comprising a plastic material encapsulating said device and leads; wherein the leads have an electrocoated, continuous, pinhole free, smooth, flexible, cured resinous moisture barrier film, consisting of an organic layer of polyimide resin, coating its surface, which film is intimately bonded to the leads and plastic encapsulant, providing a void-free moisture resistant lead-encapsulant interface.

2. The solid state device of claim 1 wherein the plastic encapsulating the device and leads comprises a resin selected from the group consisting of epoxy resin, polyester resin, silicone resin, phenolic resin and diallylphthalate resin and the electrocoated film is about 0.5 to 5 mils thick.

3. The solid state electronic device of claim 1 being an integrated circuit.

4. The solid state electronic device of claim 2 being a semiconductor device.

5. The solid state device of claim 2 wherein the plastic encapsulating the device contains filler particles and is an epoxy resin and the barier film has a uniform thickness.

6. An encapsulated, moisture resistant semiconductor device comprising a body of semiconductor material having at least two regions of opposite type semiconductivity and at least a p-n junction extending to a surface of said body, metallic electrical connection leads attached to said body and a rigid encapsulant comprising a plastic material encapsulating said body and leads; wherein an electrocoated, continuous, pinhole-free, smooth, flexible, cured resinous moisture barrier film, consisting of an organic layer of polyimide resin from about 0.5 to 5 mils thick, coats the leads' surface and is disposed between the leads and plastic encapsulant, wherein said barrier film has a microscopically intimate bond to the leads and plastic encapsulant, providing the void-free moisture resistant lead-encapsulant interface.

7. The semiconductor device of claim 6, wherein the edges of the p-n junction at the surface of the body are coated with silicone varnish, the barrier film has a uniform thickness, and the connection leads are metal plated.

8. The semiconductor device of claim 6, wherein the cured barrier film comprises polymers of aromatic polyimides having the recurring unit:

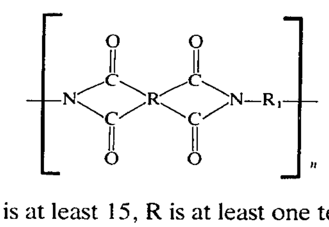

wherein *n* is at least 15, R is at least one tetravalent organic radical selected from the group consisting of:

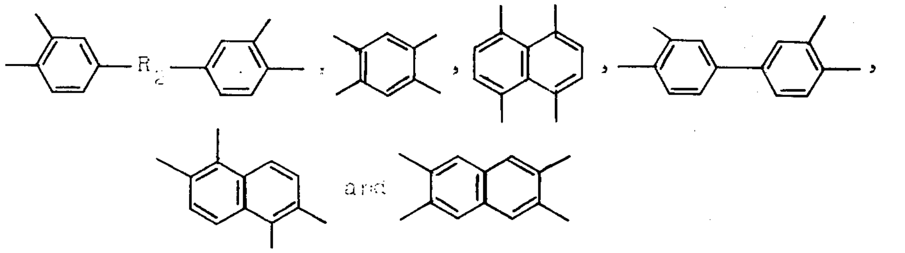

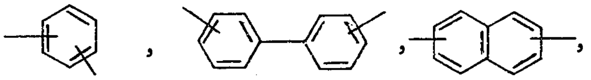

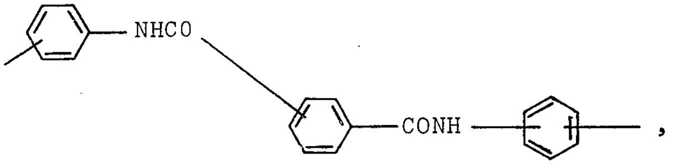

and 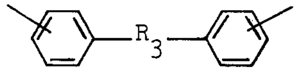

$R_2$ being selected from the group consisting of divalent aliphatic hydrocarbon radicals having from 1 to 4 carbon atoms and carbonyl, oxy, sulfo and sulfonyl radicals and in which $R_1$ is at least one divalent radical selected from the group consisting of:

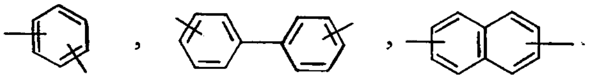

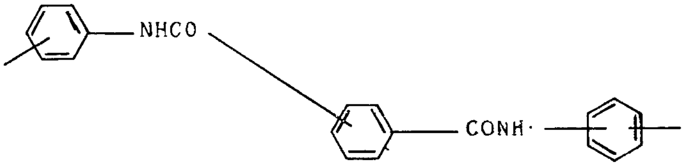

and 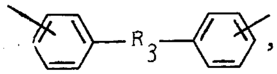

in which $R_3$ is a divalent organic radical selected from the group consisting of $R_2$, silico and amido radicals.

9. The semiconductor device of claim 6 wherein the cured barrier film comprises polymers of aromatic polyimides having the recurring unit:

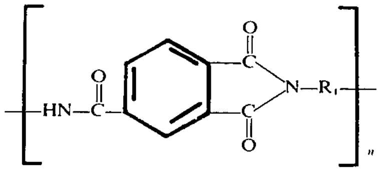

wherein *n* is at least 15 and in which $R_1$ is at least one divalent radical selected from the group consisting of:

in which $R_3$ is a divalent organic radical selected from the group consisting of a silico radical, amido radical, divalent aliphatic hydrocarbon radical having from 1 to 4 carbon atoms, oxy radical, sulfo radical and sulfonyl radical.

10. The semiconductor device of claim 9 wherein $R_1$ is

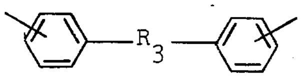

and $R_3$ is a divalent organic radical selected from the group consisting of an oxy radical and methylene radical.

* * * * *